United States Patent
Meng et al.

(10) Patent No.: US 10,488,994 B2
(45) Date of Patent: Nov. 26, 2019

(54) SINGLE LAYER CAPACITIVE SENSOR PATTERN

(71) Applicant: SYNAPTICS INCORPORATED, San Jose, CA (US)

(72) Inventors: De-Quan Meng, Jiangsu Sheng (CN); Yi-Fei Zhang, Shanghai (CN)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/254,819

(22) Filed: Sep. 1, 2016

(65) Prior Publication Data

US 2017/0068354 A1    Mar. 9, 2017

(30) Foreign Application Priority Data

Sep. 7, 2015 (CN) .................... 2015 2 0684166 U

(51) Int. Cl.
  *G06F 3/044* (2006.01)
  *H03K 17/96* (2006.01)
(52) U.S. Cl.
  CPC .......... *G06F 3/044* (2013.01); *H03K 17/962* (2013.01); *G06F 3/0443* (2019.05);
  (Continued)
(58) Field of Classification Search
  CPC .......... G06F 3/044; G06F 2203/04107; G06F 3/046; G06F 3/048; G09F 3/041
  (Continued)

(56) References Cited

U.S. PATENT DOCUMENTS 4,087,625 A    5/1978   Dym et al.
4,233,522 A    11/1980  Grummer et al.
(Continued)

FOREIGN PATENT DOCUMENTS

CN    2436978 Y    6/2001
CN    1490713 A    4/2004
(Continued)

OTHER PUBLICATIONS

Tsz-Kin Ho et al. "32.3: Simple Single-Layer Multi-Touch Projected Capacitive Touch Panel", SID 2009 Digest, pp. 447-450.
(Continued)

*Primary Examiner* — Kent W Chang
*Assistant Examiner* — Sujit Shah
(74) *Attorney, Agent, or Firm* — Patterson + Sheridan, LLP

(57) ABSTRACT

A capacitive sensor is provided that includes an array of sensor electrodes deposed in single layer on a substrate. The array includes a number of columns of sensor electrode sets arranged in a row. Each column of the sensor electrode sets includes a plurality of transmitter electrode elements and at least one receiver electrode. The transmitter electrode elements are deposed in a staggered arrangement in a direction of the column, wherein each transmitter electrode element has a trace led out from a first end thereof along the direction of column. The at least one receiver electrode is deposed along the direction of column and is interdigitated with the transmitter electrode elements for capacitively coupling with the transmitter electrode elements. At least part of the transmitter electrode elements has an extension extending from a second end of the transmitter electrode element along a direction opposite the direction of the trace.

12 Claims, 3 Drawing Sheets

(52) U.S. Cl.
CPC ............. *G06F 2203/04107* (2013.01); *H03K 2217/960755* (2013.01); *H03K 2217/960775* (2013.01)

(58) Field of Classification Search
USPC .................................................. 345/173–179
See application file for complete search history.

(56) References Cited

U.S. PATENT DOCUMENTS

| | | |
|---|---|---|
| 4,237,421 A | 12/1980 | Waldron |
| 4,264,903 A | 4/1981 | Bigelow |
| 4,293,987 A | 10/1981 | Gottbreht et al. |
| 4,484,026 A | 11/1984 | Thornburg |
| 4,492,958 A | 1/1985 | Minami |
| 4,550,221 A | 10/1985 | Mabusth |
| 4,659,874 A | 4/1987 | Landmeier |
| 4,667,259 A | 5/1987 | Uchida et al. |
| 4,677,259 A | 6/1987 | Abe |
| 4,705,919 A | 11/1987 | Dhawan |
| 4,771,138 A | 9/1988 | Dhawan |
| 4,878,013 A | 10/1989 | Andermo |
| 4,954,823 A | 9/1990 | Binstead |
| 4,999,462 A | 3/1991 | Purcell |
| 5,053,715 A | 10/1991 | Andermo |
| 5,062,916 A | 11/1991 | Aufderheide et al. |
| 5,239,307 A | 8/1993 | Andermo |
| 5,341,233 A | 8/1994 | Tomoike et al. |
| 5,459,463 A | 10/1995 | Gruaz et al. |
| 5,463,388 A | 10/1995 | Boie et al. |
| 5,650,597 A | 7/1997 | Redmayne |
| 5,657,012 A | 8/1997 | Tait |
| 5,777,596 A | 7/1998 | Herbert |
| 5,841,078 A | 11/1998 | Miller et al. |
| 5,869,790 A | 2/1999 | Shigetaka et al. |
| 6,188,391 B1 | 2/2001 | Seely et al. |
| 6,222,522 B1 | 4/2001 | Mathews et al. |
| 6,256,022 B1 | 7/2001 | Manaresi et al. |
| 6,281,888 B1 | 8/2001 | Hoffman et al. |
| 6,288,707 B1 | 9/2001 | Philipp |
| 6,297,811 B1 | 10/2001 | Kent et al. |
| 6,307,751 B1 | 10/2001 | Bodony et al. |
| 6,320,394 B1 | 11/2001 | Tartagni |
| 6,362,633 B1 | 3/2002 | Tartagni |
| 6,380,930 B1 | 4/2002 | Van Ruymbeke |
| 6,452,514 B1 | 9/2002 | Philipp |
| 6,459,044 B2 | 10/2002 | Watanabe et al. |
| 6,486,862 B1 | 11/2002 | Jacobsen et al. |
| 6,512,381 B2 | 1/2003 | Kramer |
| 6,535,200 B2 | 3/2003 | Philipp |
| 6,583,632 B2 | 6/2003 | Von Basse et al. |
| 6,653,736 B2 | 11/2003 | Kishimoto et al. |
| 6,731,120 B2 | 5/2004 | Tartagni |
| 6,771,327 B2 | 8/2004 | Sekiguchi |
| 6,825,833 B2 | 11/2004 | Mulligan et al. |
| 6,879,930 B2 | 4/2005 | Sinclair et al. |
| 6,910,634 B1 | 6/2005 | Inose et al. |
| 6,937,031 B2 | 8/2005 | Yoshioka et al. |
| 6,998,855 B2 | 2/2006 | Tartagni |
| 7,129,935 B2 | 10/2006 | Mackey |
| 7,158,125 B2 | 1/2007 | Sinclair et al. |
| 7,218,314 B2 | 5/2007 | Itoh |
| 7,306,144 B2 | 12/2007 | Moore |
| 7,327,352 B2 | 2/2008 | Keefer et al. |
| 7,339,579 B2 | 3/2008 | Richter et al. |
| 7,348,967 B2 | 3/2008 | Zadesky et al. |
| 7,382,139 B2 | 6/2008 | Mackey |
| 7,388,571 B2 | 6/2008 | Lowles et al. |
| 7,423,219 B2 | 9/2008 | Kawaguchi et al. |
| 7,423,635 B2 | 9/2008 | Taylor et al. |
| 7,439,962 B2 | 10/2008 | Reynolds et al. |
| 7,455,529 B2 | 11/2008 | Fujii et al. |
| 7,522,230 B2 | 4/2009 | Lee |
| 7,548,073 B2 | 6/2009 | Mackey et al. |
| 7,554,531 B2 | 6/2009 | Baker et al. |
| 7,589,713 B2 | 9/2009 | Sato |
| 7,663,607 B2 | 2/2010 | Hotelling et al. |
| 7,724,243 B2 | 5/2010 | Geaghan |
| 7,768,273 B1 | 8/2010 | Kalnitsky et al. |
| 7,786,981 B2 | 8/2010 | Proctor |
| 7,808,255 B2 | 10/2010 | Hristov et al. |
| 7,812,825 B2 | 10/2010 | Sinclair et al. |
| 7,821,274 B2 | 10/2010 | Philipp et al. |
| 7,821,502 B2 | 10/2010 | Hristov |
| 7,864,160 B2 | 1/2011 | Geaghan et al. |
| 7,876,309 B2 | 1/2011 | XiaoPing |
| 7,973,771 B2 | 7/2011 | Geaghan |
| 7,977,953 B2 | 7/2011 | Lee |
| 7,986,152 B2 | 7/2011 | Philipp et al. |
| 8,040,326 B2 | 10/2011 | Hotelling et al. |
| 8,059,015 B2 | 11/2011 | Hua et al. |
| 8,125,463 B2 | 2/2012 | Hotelling et al. |
| 8,243,027 B2 | 8/2012 | Hotelling et al. |
| 8,259,078 B2 | 9/2012 | Hotelling et al. |
| 8,278,571 B2 | 10/2012 | Orsley |
| 8,319,747 B2 | 11/2012 | Hotelling et al. |
| 2002/0077313 A1 | 6/2002 | Clayman |
| 2003/0052867 A1 | 3/2003 | Shigetaka et al. |
| 2003/0103043 A1 | 6/2003 | Mulligan et al. |
| 2003/0234771 A1 | 12/2003 | Mulligan et al. |
| 2004/0062012 A1 | 4/2004 | Murohara |
| 2004/0077313 A1 | 4/2004 | Oba et al. |
| 2004/0125087 A1 | 7/2004 | Taylor et al. |
| 2004/0222974 A1 | 11/2004 | Hong et al. |
| 2004/0239650 A1 | 12/2004 | Mackey |
| 2004/0252109 A1 | 12/2004 | Trent et al. |
| 2005/0030048 A1 | 2/2005 | Bolender et al. |
| 2006/0038754 A1 | 2/2006 | Kim |
| 2006/0097991 A1 | 5/2006 | Hotelling et al. |
| 2006/0114240 A1 | 6/2006 | Lin |
| 2006/0114241 A1 | 6/2006 | Lin |
| 2006/0232600 A1 | 10/2006 | Kimura et al. |
| 2007/0008299 A1 | 1/2007 | Hristov |
| 2007/0222762 A1 | 9/2007 | Van Delden et al. |
| 2007/0229466 A1 | 10/2007 | Peng et al. |
| 2007/0229468 A1 | 10/2007 | Peng et al. |
| 2007/0229469 A1 | 10/2007 | Seguine |
| 2007/0229470 A1 | 10/2007 | Snyder et al. |
| 2007/0242054 A1 | 10/2007 | Chang et al. |
| 2007/0257894 A1 | 11/2007 | Philipp |
| 2007/0262962 A1 | 11/2007 | XiaoPing et al. |
| 2007/0262963 A1 | 11/2007 | Xiao-Ping et al. |
| 2007/0268265 A1 | 11/2007 | XiaoPing |
| 2007/0273659 A1 | 11/2007 | XiaoPing et al. |
| 2007/0273660 A1 | 11/2007 | XiaoPing |
| 2007/0279395 A1 | 12/2007 | Philipp et al. |
| 2007/0291009 A1 | 12/2007 | Wright et al. |
| 2008/0006453 A1 | 1/2008 | Hotelling |
| 2008/0007534 A1 | 1/2008 | Peng et al. |
| 2008/0062140 A1 | 3/2008 | Hotelling et al. |
| 2008/0074398 A1 | 3/2008 | Wright |
| 2008/0111795 A1 | 5/2008 | Bollinger |
| 2008/0117182 A1 | 5/2008 | Um et al. |
| 2008/0150906 A1 | 6/2008 | Grivna |
| 2008/0158172 A1 | 7/2008 | Hotelling et al. |
| 2008/0158181 A1 | 7/2008 | Hamblin et al. |
| 2008/0164076 A1 | 7/2008 | Orsley |
| 2008/0218488 A1 | 9/2008 | Yang et al. |
| 2008/0245582 A1 | 10/2008 | Bytheway |
| 2008/0259044 A1 | 10/2008 | Utsunomiya et al. |
| 2008/0264699 A1 | 10/2008 | Chang et al. |
| 2008/0265914 A1 | 10/2008 | Matsushima |
| 2008/0297176 A1 | 12/2008 | Douglas |
| 2008/0308323 A1 | 12/2008 | Huang et al. |
| 2008/0309635 A1 | 12/2008 | Matsuo |
| 2009/0002337 A1 | 1/2009 | Chang |
| 2009/0002338 A1 | 1/2009 | Kinoshita et al. |
| 2009/0040191 A1 | 2/2009 | Tong et al. |
| 2009/0046077 A1 | 2/2009 | Tanaka et al. |
| 2009/0091551 A1 | 4/2009 | Hotelling et al. |
| 2009/0096757 A1 | 4/2009 | Hotelling et al. |
| 2009/0107737 A1 | 4/2009 | Reynolds et al. |
| 2009/0128518 A1 | 5/2009 | Kinoshita et al. |
| 2009/0135151 A1 | 5/2009 | Sun |
| 2009/0153509 A1 | 6/2009 | Jiang et al. |

(56) References Cited

U.S. PATENT DOCUMENTS

| | | |
|---|---|---|
| 2009/0160682 A1 | 6/2009 | Bolender et al. |
| 2009/0185100 A1 | 7/2009 | Matsuhira et al. |
| 2009/0201267 A1 | 8/2009 | Akimoto et al. |
| 2009/0207154 A1 | 8/2009 | Chino |
| 2009/0213082 A1 | 8/2009 | Ku |
| 2009/0213534 A1 | 8/2009 | Sakai |
| 2009/0236151 A1 | 9/2009 | Yeh et al. |
| 2009/0262096 A1 | 10/2009 | Teramoto |
| 2009/0267916 A1 | 10/2009 | Hotelling |
| 2009/0273571 A1 | 11/2009 | Bowens |
| 2009/0273573 A1 | 11/2009 | Hotelling |
| 2009/0277695 A1 | 11/2009 | Liu et al. |
| 2009/0283340 A1 | 11/2009 | Liu et al. |
| 2009/0303203 A1 | 12/2009 | Yilmaz et al. |
| 2009/0309850 A1 | 12/2009 | Yang |
| 2009/0314621 A1 | 12/2009 | Hotelling |
| 2009/0324621 A1 | 12/2009 | Senter et al. |
| 2010/0001966 A1 | 1/2010 | Lii et al. |
| 2010/0006347 A1 | 1/2010 | Yang |
| 2010/0013745 A1 | 1/2010 | Kim et al. |
| 2010/0013800 A1 | 1/2010 | Elias et al. |
| 2010/0044122 A1 | 2/2010 | Sleeman et al. |
| 2010/0090979 A1 | 4/2010 | Bae |
| 2010/0134422 A1 | 6/2010 | Borras |
| 2010/0140359 A1 | 6/2010 | Hamm et al. |
| 2010/0147600 A1 | 6/2010 | Orsley |
| 2010/0149108 A1 | 6/2010 | Hotelling et al. |
| 2010/0156839 A1 | 6/2010 | Ellis |
| 2010/0163394 A1 | 7/2010 | Tang et al. |
| 2010/0182273 A1 | 7/2010 | Noguchi et al. |
| 2010/0188359 A1 | 7/2010 | Lee |
| 2010/0214247 A1 | 8/2010 | Tang et al. |
| 2010/0220075 A1 | 9/2010 | Kuo et al. |
| 2010/0253646 A1 | 10/2010 | Hiratsuka |
| 2010/0258360 A1 | 10/2010 | Yilmaz |
| 2010/0265210 A1 | 10/2010 | Nakanishi et al. |
| 2010/0271330 A1 | 10/2010 | Philipp |
| 2010/0277433 A1 | 11/2010 | Lee et al. |
| 2010/0289770 A1 | 11/2010 | Lee et al. |
| 2010/0291973 A1 | 11/2010 | Nakahara et al. |
| 2010/0302201 A1 | 12/2010 | Ritter et al. |
| 2010/0321043 A1 | 12/2010 | Philipp et al. |
| 2010/0321326 A1 | 12/2010 | Grunthaner et al. |
| 2011/0018841 A1 | 1/2011 | Hristov |
| 2011/0022351 A1 | 1/2011 | Philipp et al. |
| 2011/0025639 A1 | 2/2011 | Trend et al. |
| 2011/0048812 A1 | 3/2011 | Yilmaz |
| 2011/0048813 A1 | 3/2011 | Yilmaz |
| 2011/0057887 A1 | 3/2011 | Lin et al. |
| 2011/0062969 A1 | 3/2011 | Hargreaves et al. |
| 2011/0062971 A1 | 3/2011 | Badaye |
| 2011/0063251 A1 | 3/2011 | Geaghan et al. |
| 2011/0080357 A1 | 4/2011 | Park et al. |
| 2011/0090159 A1 | 4/2011 | Kurashima |
| 2011/0096016 A1 | 4/2011 | Yilmaz |
| 2011/0109579 A1 | 5/2011 | Wang et al. |
| 2011/0109590 A1 | 5/2011 | Park |
| 2011/0141051 A1 | 6/2011 | Ryu |
| 2011/0169770 A1 | 7/2011 | Mishina et al. |
| 2011/0187666 A1 | 8/2011 | Min |
| 2011/0267300 A1 | 11/2011 | Serban et al. |
| 2011/0273391 A1 | 11/2011 | Bae |
| 2011/0279169 A1 | 11/2011 | Salaverry |
| 2012/0044171 A1 | 2/2012 | Lee et al. |
| 2012/0056820 A1 | 3/2012 | Corbridge |
| 2012/0092270 A1* | 4/2012 | Lyon .................. G06F 3/03547 345/173 |
| 2012/0313901 A1 | 12/2012 | Monson |
| 2012/0327012 A1* | 12/2012 | Hoch .................. G06F 3/044 345/174 |
| 2013/0015868 A1* | 1/2013 | Peng .................. G06F 3/044 324/688 |
| 2013/0181943 A1* | 7/2013 | Bulea .................. G06F 3/044 345/174 |
| 2013/0215035 A1* | 8/2013 | Guard .................. G06F 3/0221 345/168 |
| 2014/0225859 A1* | 8/2014 | Badaye .................. G06F 3/044 345/174 |
| 2014/0313169 A1* | 10/2014 | Kravets .................. G06F 3/044 345/178 |

FOREIGN PATENT DOCUMENTS

| | | |
|---|---|---|
| EP | 0810540 A2 | 12/1997 |
| EP | 0919945 A2 | 6/1999 |
| EP | 0977159 A1 | 2/2000 |
| JP | 2002-215330 A | 8/2002 |
| JP | 2002-268768 A | 9/2002 |
| JP | 2002268786 A | 9/2002 |
| JP | 2011002947 A | 1/2011 |
| JP | 2011002948 A | 1/2011 |
| JP | 2011002949 A | 1/2011 |
| JP | 2011002950 A | 1/2011 |
| JP | 2011004076 A | 1/2011 |
| JP | 2011100379 A | 5/2011 |
| KR | 10110118065 | 1/2012 |
| WO | WO-86/06551 A1 | 11/1986 |
| WO | WO-0057344 A1 | 9/2000 |
| WO | WO-2010117946 A2 | 10/2010 |
| WO | WO-20100136932 A1 | 12/2010 |

OTHER PUBLICATIONS

Sunkook Kim et al. "A Highly Sensitive Capacitive Touch Sensor Integrated on a Thin-Film-Encapsulated Active-Matrix OLED for Ultrathin Displays", IEEE Transactions on Electron Devices, vol. 58, No. 10, Oct. 2011.

Paul Leopardi, "A Partition of the Unit Sphere into Regions of Equal Area and Small Diameter", 2005.

ASIC Packaging Guidebook, Toshiba Corporation. (2000). 35 pages.

Fujitsu Microelectronics Limited. "IC Package." (2002). 10 pages.

Hal Philipp. "Charge Transfer Sensing", vol. 19, No. 2. 1999. pp. 96-105.

Mike Williams, "Dream Screens from Graphene", Technology Developed at Rice could Revolutionize Touch-Screen Displays. Aug. 2011.

Tracy V. Wilson et al. "How the iPhone Works", HowStuffWorks "Multi-touch Systems". 2011.

"IDT Claims World's First True Single-Layer Multi-Touch Projected Capacitive Touch Screen Technology", EE Times Europe. Dec. 8, 2010.

Shawn Day. "Low Cost Touch Sensor on the Underside of a Casing", IP.com. Oct. 14, 2004.

"Mesh Patterns for Capacitive Touch or Proximity Sensors", IP.com. May 14, 2010. 3pages.

Johannes Schoning et al. "Multi-Touch Surfaces: A Technical Guide", Technical Report TUM-I0833. 2008.

"Novel Single Layer Touchscreen Based on Indium", 2011.

Lubart, et al. "One Layer Optically Transparent Keyboard for Input Display", IP.com. Mar. 1, 1979. 3 Pages.

Gary L. Barrett et al. "Projected Capacitive Touch Technology", "Touch Technology Information Display", www.informationaldisplay.org <http://www.informationaldisplay.org>, Mar. 2010 vol. 26 No. 3, pp. 16-21.

Quantum Research Application Note An-KDO1. "Qmatrix Panel Design Guidelines", Oct. 10, 2002. 4 Pages.

Colin Holland. "SID: Single Layer Technology Boosts Capacitive Touchscreens", www.eetimes.com/General. 2011.

Calvin Wang et al. "Single Side All-Point-Addressable Clear Glass Substrate Sensor Design", IP.com. Apr. 2, 2009. 3 Pages.

Olivier Bau, "TeslaTouch: Electrovibration for Touch Surfaces", 2010.

Ken Gilleo. "The Circuit Centennial", Apr. 28, 2003, Total of 7 pages.

Ken Gilleo, "The Definitive History of the Printed Circuit", 1999 PC Fab.

(56) References Cited

OTHER PUBLICATIONS

Quantum Research Group. "Qmatrix Technology White Paper", 2006. 4 Pages.
International Search Report, PCT/US2013/021314 dated Jun. 25, 2013.

* cited by examiner

SINGLE LAYER CAPACITIVE SENSOR PATTERN

CROSS REFERENCE TO RELATED APPLICATIONS

This application claims priority to Chinese Patent Application No. 201520684166.X, filed Sep. 7, 2015, which is incorporated by reference in its entirety.

TECHNICAL FIELD

Embodiments of the invention generally relate to the technical field of touch sensors, and particularly to a capacitive sensor in which at least some of the transmitter electrode elements have extensions.

BACKGROUND

A capacitive sensor can sense a position of an input approaching a sensing area of a sensing device by detecting changes of a capacitive signal, so it is widely used in touch input devices, such as in various touch displays.

An important key component of the capacitive sensor is an array of sensor electrodes, which correspondingly is the sensing area; when an input object (e.g. a finger) is approaching the array of sensor electrodes, the capacitive signal at the corresponding position changes, thereby sensing the position or even action of the input object on the sensing area.

As for a mutual-capacitance capacitive sensor, for example, its array of sensor electrodes comprises transmitter electrodes and receiver electrodes arranged in rows and columns, wherein traces are provided on the transmitter electrodes for electrically connecting to a processing device of the capacitive sensor, so that a certain signal can be biased on the transmitter electrodes through the traces. For example, in practical application, transmitter electrodes of the array of sensor electrodes are scanned row by row (i.e. biasing the signal row by row) and changes of the regular coupling capacitance are detected.

Sensitivity and accuracy/linearity of sensing of the capacitive sensor is a constant pursuit in the industry at present, wherein the pattern and arrangement of electrodes of the array of sensor electrodes have significant influence to the sensing accuracy. But the irregular (or undesirable) coupling capacitance generated in the array of sensor electrodes is liable to negatively affect such performance as accuracy/linearity of the capacitor sensor.

SUMMARY

A capacitive sensor is provided that includes an array of sensor electrodes deposed in single layer on a substrate. The array includes a number of columns of sensor electrode sets arranged in a row. Each column of the sensor electrode sets includes a plurality of transmitter electrode elements and at least one receiver electrode. The transmitter electrode elements are deposed in a staggered arrangement in a direction of the column, wherein each transmitter electrode element has a trace led out from a first end thereof along the direction of column. The at least one receiver electrode is deposed along the direction of column and is interdigitated with the transmitter electrode elements for capacitively coupling with the transmitter electrode elements. At least part of the transmitter electrode elements has an extension extending from a second end of the transmitter electrode element along a direction opposite the direction of the trace.

BRIEF DESCRIPTION OF THE DRAWINGS

The above and other objects and advantages of the present invention will be readily appreciated as they become clearer by reference to the following detailed description in combination with the drawings, wherein the same or similar elements are denoted by the same reference numerals.

FIG. 3 is a schematic drawing of the structure of a transmitter electrode element of FIG. 2, wherein FIG. 3(a) is a transmitter electrode element according to one embodiment, and FIG. 3(b) is a transmitter electrode element according to a further embodiment.

DETAILED DESCRIPTION

Figure 1:
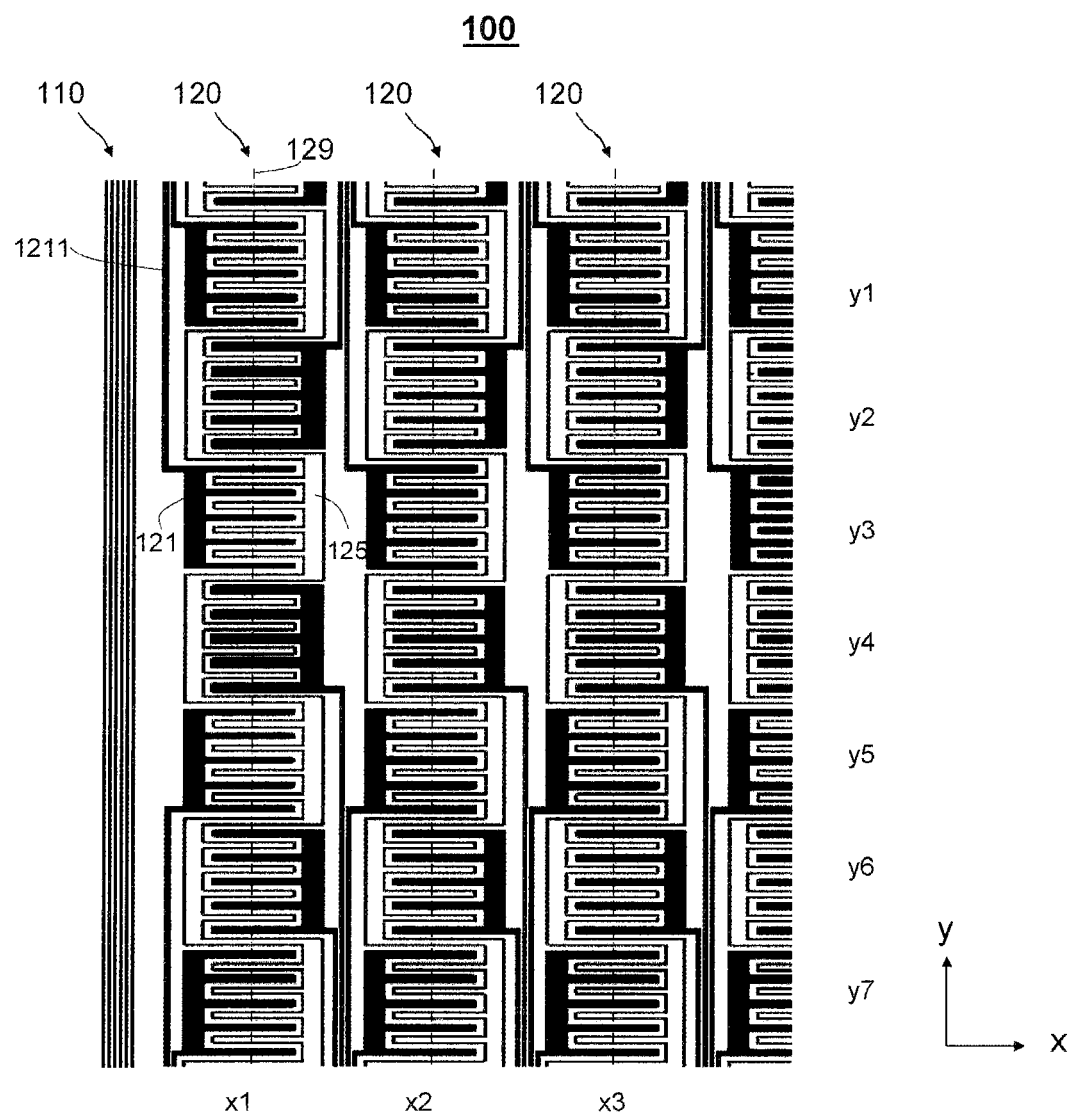
FIG. 1 is a schematic drawing of the structure of an array of sensor electrodes of an existing capacitive sensor.

A benefit of the disclosed technology is to reduce irregular capacitive coupling in the array of sensor electrodes of the capacitive sensor so as to improve performance of the capacitive sensor.

In order to achieve the above-mentioned or other benefit, a capacitive sensor according to the present invention comprises a substrate and an array of sensor electrodes disposed on the substrate in single layer, the array of sensor electrodes including a number of columns of sensor electrode sets orderly arranged in a direction of row; wherein each column of the sensor electrode sets including:

a plurality of transmitter electrode elements which are disposed in an orderly staggered arrangement in the direction of column, wherein each transmitter electrode element has a trace led out from a first end thereof along the direction of column; and at least one receiver electrode which is disposed meanderingly along the direction of column and is interdigitated with the transmitter electrode elements for capacitively coupling with the transmitter electrode elements;

wherein at least part of the transmitter electrode elements have an extension extended from a second end of the transmitter electrode element along a direction opposite the direction of the trace.

In one example, a length of the extension is equal to half of a length of the transmitter electrode element in the direction of column.

A capacitive sensor according to an embodiment of the present invention, wherein, each of the plurality of transmitter electrode elements has the extension;

the capacitive sensor comprises n columns of sensor electrode sets, each column of the sensor electrode sets including m rows of the transmitter electrode element; wherein the extension of row c of the transmitter electrode element of column i of the sensor electrode sets is located between a part of receiver electrode corresponding to row (c+1)/(c−1) of the transmitter electrode element of column i of the sensor electrode sets and row (c+1)/(c−1) of the transmitter electrode element of column (i+1) or (i−1) of the sensor electrode sets; wherein, $2 \leq i < n$, $n \geq 3$, $2 \leq c < m$, $m \geq 3$, and m, n, i and c are integers.

A capacitive sensor according to another embodiment of the present invention, wherein the capacitive sensor comprises n columns of the sensor electrode sets, each column of sensor electrode sets including m rows of transmitter electrode element;

wherein the traces of rows 1 to t of the transmitter electrode element of n columns of the sensor electrode sets are upwards led out from along the direction of column, and the traces of rows (t+1) to m of the transmitter electrode element of n columns of the sensor electrode sets are downwards led out from along the direction of column; wherein $2 \leq t < (m-2)$, $m \geq 4$, $n \geq 3$, and m, n and t are an integer;

wherein at least rows (t−1) to (t+2) of the transmitter electrode element of n columns of the sensor electrodes have the extension.

In one example, the extensions, extended from rows (t+1) and (t−1)/t and (t−2) of the transmitter electrode elements of column (i+1) or (i−1) of the sensor electrode sets respectively, are disposed corresponding to row t/(t+1) of the transmitter electrode element of column i of the sensor electrode sets; wherein $2 \leq i < n$, and i is an integer.

In any one of the above-described capacitive sensors, the array of sensor electrodes further includes a border; wherein a plurality of the traces are disposed in the border, and the extension of row c of the transmitter electrode elements of the first column of the sensor electrode sets is located between a part of receiver electrode corresponding to row (c+1) or (c−1) of the transmitter electrode element of the first column of the sensor electrode sets and the border; wherein $2 \leq c < m$, and c is an integer.

In one example, the extension of row f of the transmitter electrode element of column i of the sensor electrode sets is relatively close to row (f+1)/(f−1) of the transmitter electrode element of column (i+1) or (i−1) of the sensor electrode sets; wherein, $(t-1) \leq f \leq (t+1)$, and f is an integer.

In one example, the extension is an extension line, whose width is equal to the width of the trace.

In one example, each transmitter electrode element is disposed across a central line in the direction of column of the sensor electrode sets.

In one embodiment, the substrate is one element of a display panel of a display.

The irregular capacitive coupling in the array of sensor electrodes of the capacitive sensor of the present invention is shielded and reduced by the extensions, so that the accuracy/linearity of the capacitive sensor is improved.

Some of a plurality of possible embodiments of the present invention are described below to provide a basic understanding of the present invention, but they do not intend to define the key or decisive factors of the present invention or limit the claimed protection scope.

Figure 2:
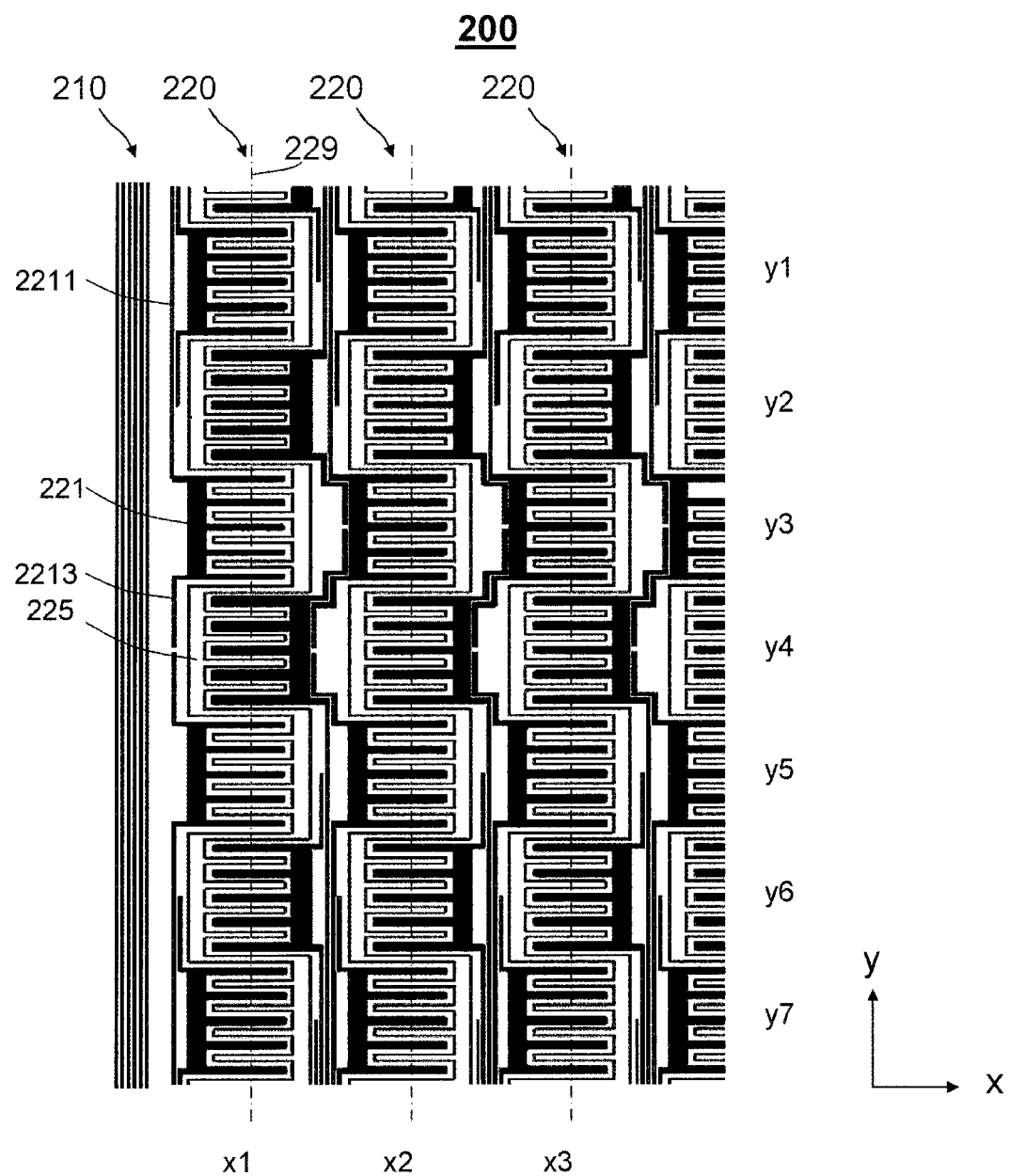
FIG. 2 is a schematic drawing of the structure of an array of sensor electrodes of a capacitive sensor according to an embodiment of the present invention.

FIG. 1 is a schematic drawing of the structure of an array of sensor electrodes of an existing capacitive sensor. FIG. 2 is a schematic drawing of the structure of an array of sensor electrodes of a capacitive sensor according to an embodiment of the present invention. The array of sensor electrodes of a capacitive sensor according to the present invention is described below with reference to the improvement to the existing array of sensor electrodes as shown in FIG. 1, but it shall be appreciated that the array of sensor electrodes of the present invention is not limited to be formed by improving the array of sensor electrodes as shown in FIG. 1. To make the description convenient and clear, the direction of row in the array of sensor electrodes is defined as direction x, and the direction of column is defined as direction y.

FIG. 1 shows an array 100 of sensor electrodes of a local capacitive sensor, which comprises a border 110 and several columns of sensor electrode sets 120 orderly arranged in direction x, the sensor electrode set 120 mainly consisting of several transmitter electrode elements 121 and one receiver electrode 125. An example of 7 rows×3 columns is described, x1, x2 and x3 are coordinates of the column, while y1, y2, y3, y4, y5, y6 and y7 are coordinates of the row; taking column x1 shown in FIG. 1 as an example, its sensor electrode set 120 comprises 7 transmitter electrode elements 121, each being arranged across a central line 129 of column x1 of the sensor electrode set 120 and being orderly staggered arrangement in direction y; column x1 of the sensor electrode set 120 further comprises a receiver electrode 125, which is meanderingly arranged in direction y and is interdigitated with each transmitter electrode element 121. In this embodiment, each transmitter electrode element 121 is substantially designed in a comb shape, and the receiver electrode portion corresponding to each transmitter electrode element 121 is also substantially designed in a comb shape, so that each transmitter electrode element 121 and the corresponding receiver electrode portion form an interdigitated comb-shape element structure, in which the transmitter electrode element 121 is capacitively coupled to the corresponding receiver electrode, thus the capacitive signal changes can be detected when an input object is approaching.

It shall be noted that the capacitance formed between each transmitter electrode element 121 and its corresponding interdigitatedly coupled receiver electrode portion is a regular capacitance. However, the applicant found that when normally scanning the array 100 of the sensor electrodes, trace 1211 led out from a certain row of scanned transmitter electrode elements 121 also has the same bias signals, which will cause irregular capacitive coupling with receiver electrode portions of other rows; besides, in the certain row of scanned transmitter electrode elements 121, a certain column of transmitter electrode elements 121 will also generate irregular capacitive coupling with receiver electrodes of the adjacent column. Thus in practical application, such phenomenon as "ghosts" will appear in the capacitive sensor as shown in FIG. 1, especially in areas corresponding to the transmitter electrode elements of the central rows (e.g. rows y3-y4).

The capacitive sensor according to an embodiment of the present invention is as shown in FIG. 2, which comprises a substrate (not shown in FIG. 2) and an array 200 of sensor electrodes formed on the substrate, the array 200 of sensor electrodes is a single-layer structure, which can be formed by means of various patterning methods. The substrate can be a component of a display panel in a display, such as a color filter (CF), etc., and the array 200 of sensor electrodes can be, but is not limited to, a transparent electrode structure formed by an ITO material.

FIG. 2 shows a local structure (e.g. 7 rows×3 columns) of the array 200 of sensor electrodes, which comprises a border 210 and three columns of sensor electrode sets 220 orderly arranged in direction x. In this embodiment, the sensor electrode set 220 mainly consists of a number of transmitter electrode elements 221 and one receiver electrode 225. Each of the transmitter electrode elements 221 is disposed across a central line 229 (along direction y) corresponding to the sensor electrode set 220 and is ordered staggered in direction y. The receiver electrode 225 is meanderingly arranged in direction y and is interdigitated with each transmitter electrode element 121. In this way, each transmitter electrode element 221 is capacitively coupled to the receiver electrode portion arranged interdigitatedly therewith.

To facilitate illustration, the transmitter electrode element is denoted by T, and the receiver electrode is denoted by R, for example, the transmitter electrode element of row c in the sensor electrode set 220 of column i is denoted by T ($x_i$, $y_c$), and its corresponding capacitively coupled receiver electrode portion is denoted by R ($x_i$, $y_c$), wherein i is an integer greater than or equal to 1 but smaller than or equal to n, c is an integer greater than or equal to 1 but smaller than or equal to m, n is the number of columns of the sensor electrode sets 220 of the array 200 of the sensor electrodes, and m is the number of rows of the transmitter electrode elements of the sensor electrode sets 220 of the array 200 of the sensor electrodes.

Figure 3:
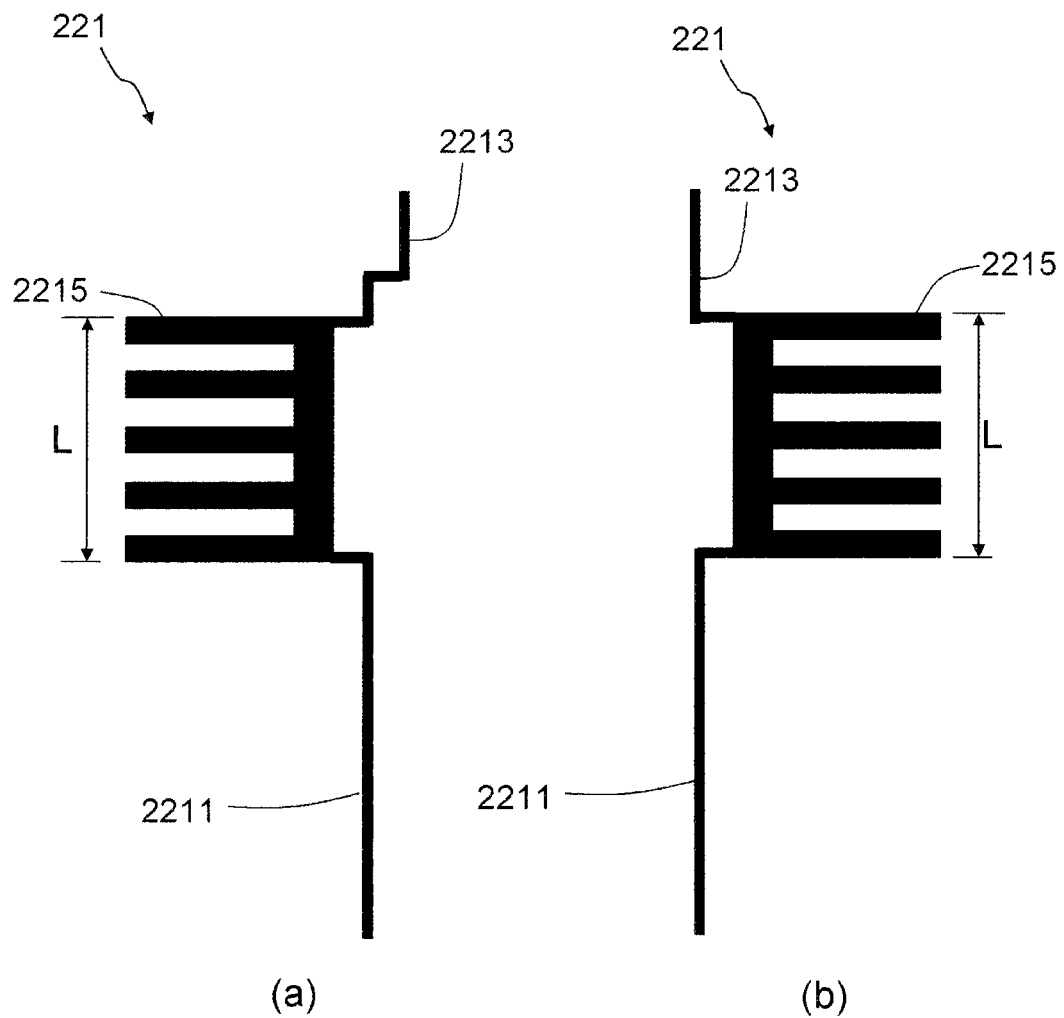

FIG. 3 is a schematic drawing of the structure of a transmitter electrode element of FIG. 2, wherein FIG. 3(*a*) is a transmitter electrode element according to one embodiment, and FIG. 3(*b*) is a transmitter electrode element according to a further embodiment. Referring to FIGS. 2 and 3, in one embodiment, each transmitter electrode element 221 has an upper end and a lower end. One end of the transmitter electrode element 221 has a trace 2211 led out therefrom. The trace 2211 electrically connects the transmitter electrode element 221 to the processing device of the capacitive sensor, so that during the scanning operation, scanning signals can be selectively biased to the corresponding transmitter electrode element 221 in the array through the trace thereof. The other end of the transmitter electrode element 221 has an extension 2213 extending therefrom. The extension 2213 can specifically be an extension line whose width may be substantially equal to the width of the trace 2211. The extending direction of the extension 2213 is opposite to the leading out direction of the trace 2211, that is, the extension extends in a direction opposite to the direction of the trace 2211. Thus, the extension 2213 is between transmitter electrode elements and receiver electrodes of different columns in adjacent rows, or it is between the receiver electrode and border 210 of adjacent rows. It shall be noted that in order to facilitate the layout, a plurality of traces 2211 are provided at the border 210, so that the traces 2211 led out from below are all led to another position from the border 210

Still referring to FIG. 2, taking the transmitter electrode element T ($x_1$, $y_3$) as an example, the trace 2211 thereof is led out upward along a positive direction y, and the extension 2213 thereof extends downward along a negative direction y. The extension 2213 is disposed between R ($x_1$, $y_4$) and the border 210. Likewise, as for the transmitter electrode element T (x1, y5), the trace 2211 thereof is led out downward along a negative direction y, and the extension 2213 thereof extends upward along a positive direction y. The extension 2213 is disposed between R ($x_1$, $y_4$) and the border 210. Therefore, R ($x_1$, $y_4$) correspondingly has two extensions 2213 extending respectively from the upper and lower adjacent transmitter electrode elements. In this case, when row 4 is scanned and rows 3 and 5 are connected to the GND signal, the two extensions 2213 connecting ground can at least partially shield the irregular coupling capacitance between R ($x_1$, $y_4$) and the traces of the border 210.

Continuing to refer to FIG. 2, in this embodiment, the m rows of transmitter electrode elements are exemplarily arranged in substantially an F-shape. Traces of the upper transmitter electrode elements (e.g. all transmitter electrode elements in rows 1-3 as shown in FIG. 2) are led out upward, so they are arranged in an inverted F-shape. Traces of the lower transmitter electrode elements (e.g. all transmitter electrode elements in rows 4-7 as shown in FIG. 2) are led out downward, so they are arranged in an F-shape. As for the transmitter electrode elements and receiver electrode portions corresponding to the two adjacent rows located the boundary between the upper and lower parts, the applicant found that irregular coupling capacitance is more likely to occur therein. Thus, "ghosts" are readily to appear when using. In this embodiment, between the upper and lower parts, extensions 2213 extending respectively from row 4 and row 2 are provided between row 3 of the transmitter electrode elements T and the adjacent column of receiver electrodes R, and extensions 2213 extending respectively from row 3 and row 5 are provided between row 4 of the transmitter electrode elements T and the adjacent columns of receiver electrodes R.

The transmitter electrode element T ($x_2$, $y_4$) is used herein as an example. Two extensions 2213 extending respectively from T ($x_3$, $y_3$) and T ($x_3$, $y_5$) are provided between T ($x_2$, $y_4$) and R ($x_3$, $y_4$). Thus, when row 4 of the transmitter electrode elements are scanned and biased signals, since T ($x_3$, $y_3$) and T ($x_3$, $y_5$) are biased as ground signals, the two extensions 2213 are grounded so as to shield the irregular coupling capacitance between T ($x_2$, $y_4$) and R ($x_3$, $y_4$). Therefore, the irregular capacitance between the upper and lower parts is greatly reduced. All transmitter electrode elements T of row 3 and row 4 have the similar configuration.

In an embodiment, a length of the extension 2213, i.e., a length of its extension from the transmitter electrode element 221, is substantially equal to a half of a length L (as shown in FIG. 3) of the transmitter electrode element 221 in direction y. In this example, the extension 2213 has a better effect of shielding the irregular capacitance. However, the specific length thereof is not restrictive, for example, the length of the extension 2213 can be L/4 to 3L/4. It shall also be noted that there is no electrical connection between different extensions.

In one embodiment, each transmitter electrode element 221 is substantially designed in a comb shape, and the receiver electrode portion corresponding to each transmitter electrode element 221 is also substantially designed in a comb shape. Thus, each transmitter electrode element 221 and the corresponding receiver electrode portion form an interdigitated comb-shape element structure, as shown in FIG. 3, and each transmitter electrode element 221 further comprises a plurality of electrode segments 2215 arranged in parallel, and an electrode segment of the receiver electrode 225 can be disposed between two adjacent electrode segments 2215.

In an embodiment, as shown in FIG. 3(*a*), the extension 2213 of the transmitter electrode 221 first extends more in direction x and then bends vertically to extend in direction y to form an extension line. Thus similar to the extension 2213 between T($x_2$, $y_4$) and R ($x_3$, $y_4$), the two extensions 2213 are disposed relatively closer to T ($x_2$, $y_4$), thereby enhancing the above-mentioned shielding effect.

In an embodiment, in a global layout of the array 200 of the sensor electrodes, all transmitter electrode elements 221 are provided with extensions 2213, as shown in FIG. 2, all transmitter electrode elements of rows 1-3 are provided with extensions 2213 extending downward, and all transmitter electrode elements of rows 4-7 are provided with extensions 2213 extending upward. Thus, the global capacitance environment of the array 200 of the sensor electrodes is relatively more uniform. It shall be appreciated that in other embodiments, extensions may be disposed only on rows 2-5 of the transmitter electrode elements 221, thereby at least ensuring that the irregular capacitance at row 3 and row 4 between the upper and lower parts is greatly reduced.

The irregular capacitive coupling in the array 200 of sensor electrodes of the capacitive sensor of the embodiment of the present invention is greatly reduced (because it is shielded by the extensions), so the accuracy/linearity of the capacitive sensor is improved, for example, the accuracy is approximately improved by about 0.5 mm as compared to the capacitive sensor shown in FIG. 1. Hence, when applying such a capacitive sensor to the touch display, user experience will be improved over conventional designs.

The above examples mainly illustrate the capacitive sensor of the present invention. Although only some of the embodiments of the present invention are described, those ordinarily skilled in the art shall understand that this invention can be implemented in various other forms without departing from its principle and scope. Thus, the illustrated examples and embodiments are illustrative but not restrictive, and various modifications and replacements are intended to be covered by this invention without departing from the spirit and scope of the invention as defined by the appended claims.

What is claimed is:

1. A capacitive sensor, comprising:
   a substrate; and
   an array of sensor electrodes disposed on the substrate in single layer, the array of sensor electrodes including a number of columns of sensor electrode sets orderly arranged in a direction of row, wherein each column of the sensor electrode sets comprises:
   a plurality of transmitter electrode elements disposed in an orderly staggered arrangement in the direction of a column, wherein a first transmitter electrode element of the plurality of transmitter electrode elements comprises a first trace having a first end and a second end, the first trace extending in the direction of the column, and a plurality of second traces extending from the first trace in the direction of a row, the first transmitter electrode element further having a first extension trace comprising a first portion led out from the first end of the first trace along the direction of the row opposite the second traces, a second portion coupled to the first portion extending along the direction of the column, a third portion coupled to the second portion extending along the direction of the row opposite the second traces, and a fourth portion coupled to the third portion extending along the direction of the column; and
   at least one receiver electrode which is disposed meanderingly along the direction of the column and is interdigitated with the transmitter electrode elements for capacitively coupling with the transmitter electrode elements, wherein a first transmitter electrode element has a second extension trace extended from the second end of the first trace comprising a first portion led out from the second end of the first trace along the direction of the row opposite the second traces and a second portion coupled to the first portion extending along the direction of the column opposite the direction of the second portion of the first extension trace, where the first extension trace extends further along the direction of the row opposite the second traces than the second extension trace.

2. The capacitive sensor according to claim 1, wherein a length of the first extension is equal to half of a length of the first transmitter electrode element in the direction of the column.

3. The capacitive sensor according to claim 1, wherein each of the plurality of transmitter electrode elements has the first extension; and wherein:
the capacitive sensor comprises n columns of sensor electrode sets, each column of sensor electrode sets including m rows of the first transmitter electrode;
wherein the extension of row c of the transmitter electrode element of column i of the sensor electrode sets is located between a part of a receiver electrode corresponding to row (c+1)/(c−1) of the transmitter electrode element of column i of the sensor electrode sets and row (c+1)/(c−1) of the transmitter electrode element of column (i+1) or (i−1) of the sensor electrode sets; wherein, $2 \leq i < n$, $n \geq 3$ $2 \leq c < m$, $m \geq 3$, and m, n, i and c are integers.

4. The capacitive sensor according to claim 1, wherein the capacitive sensor comprises n columns of the sensor electrode sets, each column of sensor electrode sets including m rows of transmitter electrode elements;
wherein the traces of rows 1 to t of the transmitter electrode element of n columns of the sensor electrode sets are upwards led out from along the direction of the column, and the traces of rows (t+1) to m of the transmitter electrode element of n columns of the sensor electrode sets are downwards led out from along the direction of the column; wherein $t < (m-2)$, $m \geq 4$, $n \geq 3$, and m, n and t are integers; and
wherein at least rows (t−1) to (t+2) of the transmitter electrode elements of n columns of the sensor electrodes have the first extension.

5. The capacitive sensor according to claim 4, wherein the first extensions, extended from rows (t+1) and (t−1)/ t and (t−2) of the transmitter electrode elements of column (i+1) or (i−1) of the sensor electrode sets respectively, are disposed corresponding to row t/(t+1) of the transmitter electrode elements of column i of the sensor electrode sets; wherein $2 \leq i < n$, wherein i is an integer.

6. The capacitive sensor according to claim 3, wherein the array of sensor electrodes further comprises a border;
wherein a plurality of the traces are disposed in the border, and the first extension of row c of the transmitter electrode elements of the first column of the sensor electrode sets is located between a part of a receiver electrode corresponding to row (c+1) or (c−1) of the transmitter electrode element of the first column of the sensor electrode sets and the border; wherein $2 \leq c < m$, and c is an integer.

7. The capacitive sensor according to claim 4, wherein the array of sensor electrodes further comprises a border;
wherein a plurality of the traces are disposed in the border, and the first extension of row c of the transmitter electrode elements of the first column of the sensor electrode sets is located between a part of a receiver electrode corresponding to row (c+1) or (c−1) of the transmitter electrode element of the first column of the sensor electrode sets and the border; wherein $2 \leq c < m$, and c is an integer.

8. The capacitive sensor according to claim 4, wherein the first extension of row f of the transmitter electrode element of column i of the sensor electrode sets is relatively close to row (f+1)/(f−1) of the transmitter electrode elements of column (i+1) or (i−1) of the sensor electrode sets; wherein, $(t−1) \leq f \leq (t+1)$, and f is an integer.

9. The capacitive sensor according to claim 5, wherein the first extension of row f of the transmitter electrode element of column i of the sensor electrode sets is relatively close to row (f+1)/(f−1) of the transmitter electrode element of column (i+1) or (i−1) of the sensor electrode sets; wherein, $(t−1) \leq f \leq (t+1)$, and f is an integer.

10. The capacitive sensor according to claim 1, wherein the first extension is an extending line having a width equal to a width of the first trace.

11. The capacitive sensor according to claim 1, wherein each transmitter electrode is disposed across a center line in the direction of a column of the sensor electrode sets.

12. The capacitive sensor according to claim 1, wherein the substrate is one element of a displaying panel of a display.

* * * * *

UNITED STATES PATENT AND TRADEMARK OFFICE
CERTIFICATE OF CORRECTION

PATENT NO. : 10,488,994 B2
APPLICATION NO. : 15/254819
DATED : November 26, 2019
INVENTOR(S) : De-Quan Meng and Yi-Fei Zhang Page 1 of 1

It is certified that error appears in the above-identified patent and that said Letters Patent is hereby corrected as shown below:

In the Claims

In Column 8, Line 11, in Claim 3, delete "n≥3" and insert -- $n \geq 3$, --, therefor.

In Column 8, Line 24, in Claim 4, delete "wherein" and insert -- wherein $2 \leq$ --, therefor.

Signed and Sealed this
Twenty-fourth Day of November, 2020

Andrei Iancu
*Director of the United States Patent and Trademark Office*